US010607891B2

(12) United States Patent
Yeh et al.

(10) Patent No.: US 10,607,891 B2
(45) Date of Patent: Mar. 31, 2020

(54) MANUFACTURING METHOD OF SEMICONDUCTOR DEVICE

(71) Applicant: UNITED MICROELECTRONICS CORP., Hsin-Chu (TW)

(72) Inventors: Jiun-Lin Yeh, Hsinchu County (TW); Hsueh-Chih Tseng, Nantou County (TW); Chia-Chen Tsai, Tainan (TW); Ta-Kang Lo, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/803,865

(22) Filed: Nov. 6, 2017

(65) Prior Publication Data

US 2019/0115259 A1  Apr. 18, 2019

(30) Foreign Application Priority Data

Oct. 13, 2017  (CN) .......................... 2017 1 0953110

(51) Int. Cl.
*H01L 29/66* (2006.01)
*H01L 29/78* (2006.01)
(Continued)

(52) U.S. Cl.
CPC .... *H01L 21/823425* (2013.01); *H01L 21/266* (2013.01); *H01L 21/26586* (2013.01);
(Continued)

(58) Field of Classification Search
CPC ......... H01L 21/26506; H01L 21/26586; H01L 21/3065; H01L 29/165; H01L 29/7848;
(Continued)

(56) References Cited

U.S. PATENT DOCUMENTS

2002/0019103 A1* 2/2002 Lin .................... H01L 21/26586
438/302
2003/0224574 A1* 12/2003 Cho .................. H01L 21/82345
438/275
(Continued)

OTHER PUBLICATIONS

Chien, Title of Invention: Method for Manufacturing FINFET Semiconductor Device, U.S. Appl. No. 14/279,340, filed May 16, 2014.

*Primary Examiner* — Brian Turner
(74) *Attorney, Agent, or Firm* — Winston Hsu

(57) ABSTRACT

A manufacturing method of a semiconductor device includes following steps. First gate structures and second gate structures are formed on a first region and a second region of a semiconductor substrate respectively. A spacing distance between the second gate structures is larger than that between the first gate structures. A first ion implantation is preformed to form a first doped region between the first gate structures. A second ion implantation is performed to form a second doped region between the second gate structures. A tilt angle of the second ion implantation is larger than that of the first ion implantation. An implantation dose of the second ion implantation is lower than that of the first ion implantation. An etching process is performed to at least partially remove the first doped region to form a first recess and at least partially remove the second doped region to form a second recess.

17 Claims, 9 Drawing Sheets

(51) Int. Cl.
*H01L 21/8234* (2006.01)
*H01L 21/8238* (2006.01)
*H01L 21/336* (2006.01)
*H01L 21/265* (2006.01)
*H01L 21/266* (2006.01)
*H01L 27/02* (2006.01)
*H01L 21/306* (2006.01)
*H01L 21/3065* (2006.01)
*H01L 21/84* (2006.01)

(52) U.S. Cl.
CPC .......... *H01L 21/823431* (2013.01); *H01L 21/823456* (2013.01); *H01L 27/0207* (2013.01); *H01L 29/6656* (2013.01); *H01L 29/66636* (2013.01); *H01L 29/7848* (2013.01); H01L 21/3065 (2013.01); H01L 21/30604 (2013.01); H01L 21/84 (2013.01)

(58) Field of Classification Search
CPC ........... H01L 29/6659; H01L 29/66636; H01L 29/7833; H01L 29/6653
See application file for complete search history.

(56) References Cited

U.S. PATENT DOCUMENTS

| | | | |
|---|---|---|---|
| 2004/0132268 A1* | 7/2004 | Koo | C23C 14/021 438/583 |
| 2006/0008973 A1* | 1/2006 | Phua | H01L 21/26586 438/231 |
| 2006/0105511 A1 | 5/2006 | Yang | |
| 2006/0234455 A1* | 10/2006 | Chen | H01L 21/26506 438/276 |
| 2009/0280627 A1* | 11/2009 | Pal | H01L 21/26506 438/504 |
| 2010/0110320 A1* | 5/2010 | Kitakado | G02F 1/136286 349/39 |
| 2012/0056245 A1* | 3/2012 | Kang | H01L 21/0245 257/192 |
| 2012/0091531 A1* | 4/2012 | Baldwin | H01L 21/823412 257/368 |
| 2012/0100681 A1* | 4/2012 | Fang | H01L 21/02057 438/269 |
| 2013/0256797 A1* | 10/2013 | Chang | H01L 21/823437 257/347 |
| 2014/0011340 A1* | 1/2014 | Song | H01L 29/6653 438/478 |
| 2014/0141589 A1* | 5/2014 | Shin | H01L 29/66568 438/306 |
| 2015/0179654 A1* | 6/2015 | Mehrotra | H01L 27/1104 257/77 |
| 2015/0303283 A1* | 10/2015 | Chien | H01L 29/66803 438/478 |
| 2016/0284720 A1* | 9/2016 | Ema | H01L 27/11573 |
| 2016/0284808 A1* | 9/2016 | Yang | H01L 29/42372 |
| 2017/0221906 A1* | 8/2017 | Lin | H01L 21/3065 |

* cited by examiner

MANUFACTURING METHOD OF SEMICONDUCTOR DEVICE

BACKGROUND OF THE INVENTION

1. Field of the Invention

The present invention relates to a manufacturing method of a semiconductor device, and more particularly, to a manufacturing method including an ion implantation.

2. Description of the Prior Art

With the development of technologies in the semiconductor integrated circuit industry, more and more semiconductor devices can be integrated in one semiconductor integrated circuit (IC), and the size of an individual semiconductor device becomes smaller and smaller. A field-effect transistor (FET) is a typical semiconductor device that constitutes a basic unit in a semiconductor IC. An FET includes a gate structure formed on a semiconductor substrate, as well as a source and a drain formed in the semiconductor substrate adjacent to the gate structure. Conventionally, the source and the drain are formed by doping the semiconductor substrate. With the integrity of the IC becomes higher and the FETs in the IC become smaller, different processes have been developed for forming the source and drain. One of these processes involves using an epitaxial technique to form the source and the drain. According to this process, the semiconductor substrate is etched to form recesses, and then a semiconductor material is formed in the recesses by an epitaxial process to form the source and the drain.

The semiconductor material formed in the recesses may be different for different types of FETs. For example, for a P-channel FET, silicon germanium (SiGe) can be formed in the recesses to form the source and drain. Since SiGe has a larger lattice constant than Si, an SiGe source/drain introduces a compressive stress in the channel of the FET, which increases the hole mobility in the channel. Additionally, for an N-channel FET, phosphorous-doped Si (Si:P) can be formed in the recesses to form the source and drain. However, material properties of the materials formed by the epitaxial growth tend to be influenced by conditions of defects, such as stacking faults. The electrical performance of the transistors may be different from one another when the distribution of the defects is not uniform. The uniformity of the electrical properties between different transistors may become worse, and the manufacturing yield may be affected directly.

SUMMARY OF THE INVENTION

A manufacturing method of a semiconductor device is provided in the present invention. Ion implantations with different process conditions are performed to regions with different spacing distances between gate structures respectively for forming required doped regions. The difference between the influences from the ion implantations applied to the regions with different spacing distances between gate structures may be reduced, and the uniformity of the electrical properties of the semiconductor device may be improved accordingly.

According to an embodiment of the present invention, a manufacturing method of a semiconductor device is provided. The manufacturing method includes the following steps. A semiconductor substrate is provided, and the semiconductor substrate includes a first region and a second region defined thereon. A plurality of first gate structures is formed on the first region of the semiconductor substrate. A plurality of second gate structures is formed on the second region of the semiconductor substrate. A spacing distance between the second gate structures is larger than a spacing distance between the first gate structures. A first ion implantation is performed to forma first doped region in the semiconductor substrate between the first gate structures. A second ion implantation is performed to forma second doped region in the semiconductor substrate between the second gate structures. A tilt angle of the second ion implantation is larger than a tilt angle of the first ion implantation, and an implantation dose of the second ion implantation is lower than an implantation dose of the first ion implantation. An etching process is performed to remove at least a part of the first doped region to form a first recess in the semiconductor substrate and remove at least a part of the second doped region to form a second recess in the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a manufacturing method of a semiconductor device according to a first embodiment of the present invention, wherein FIG. 2 is a cross-sectional diagram taken along a line A-A' in FIG. 1;

FIG. 3 is a schematic drawing in a step subsequent to FIG. 2,

FIG. 4 is a schematic drawing in a step subsequent to FIG. 3,

FIG. 5 is a schematic drawing in a step subsequent to FIG. 4, and

FIG. 6 is a schematic drawing in a step subsequent to FIG. 5.

FIG. 8 and FIG. 9 are schematic drawings illustrating a manufacturing method of a semiconductor device according to a second embodiment of the present invention, wherein FIG. 9 is a schematic drawing in a step subsequent to FIG. 8.

DETAILED DESCRIPTION

Figure 1:
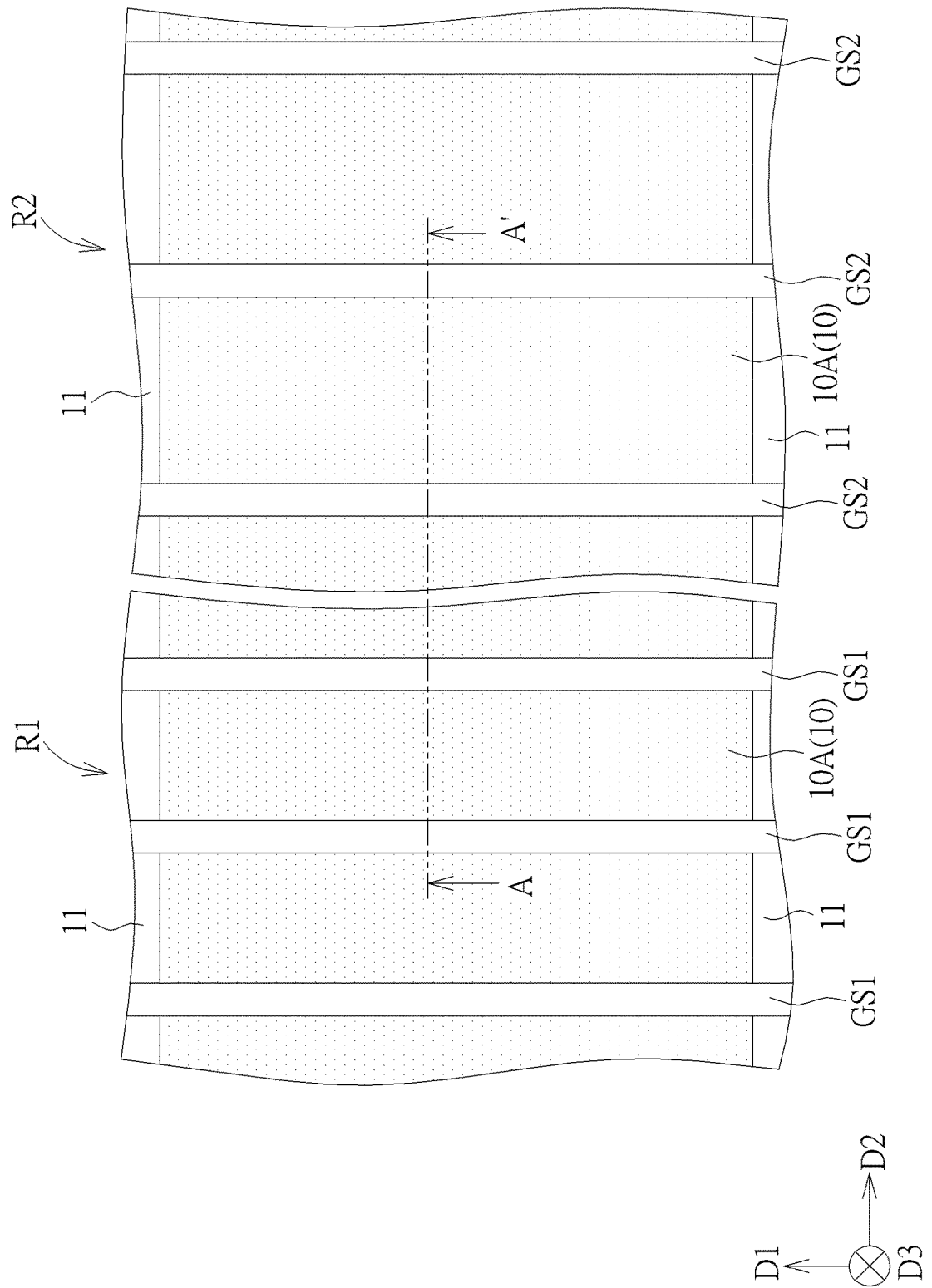
Figure 2:
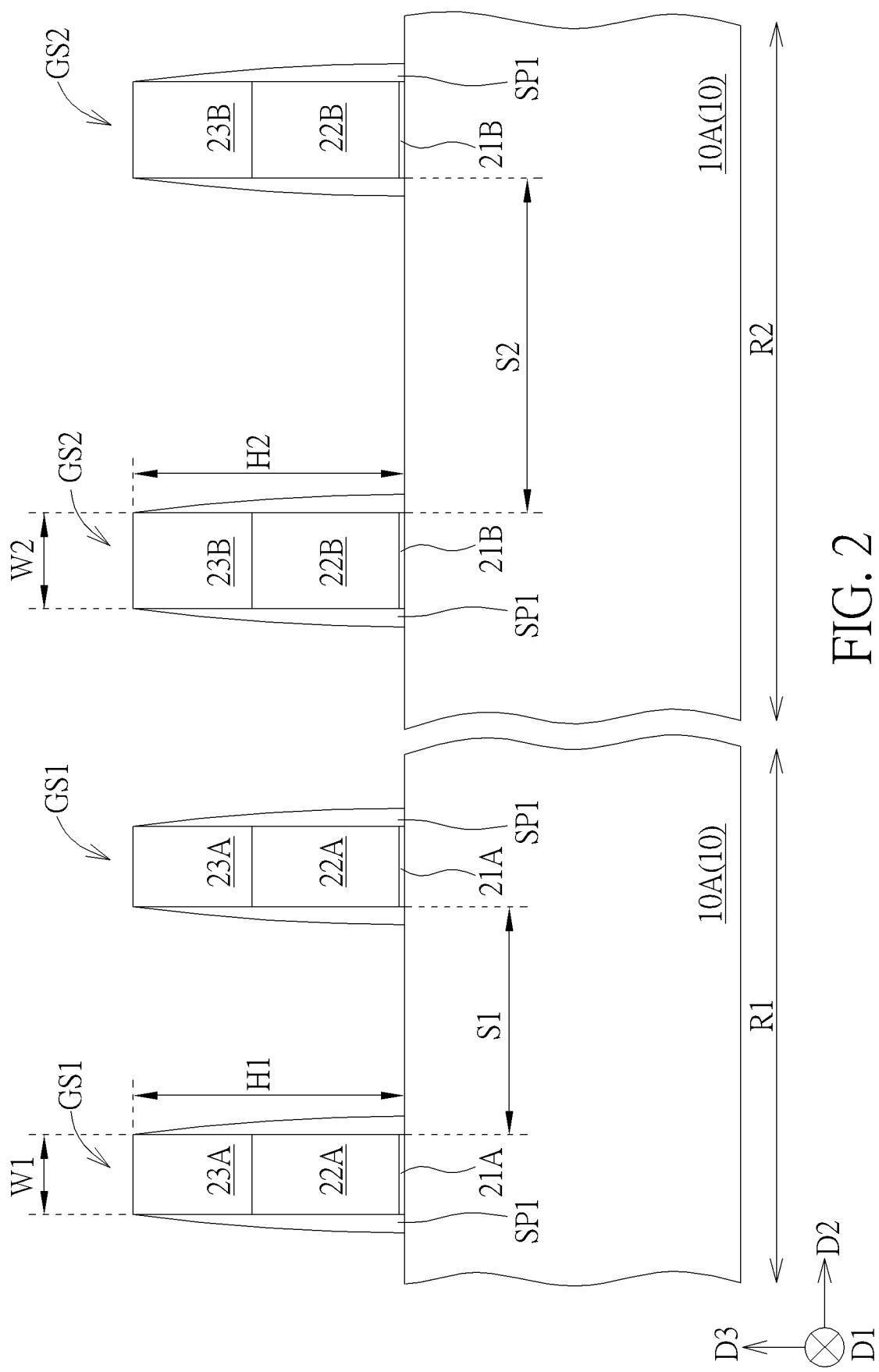

Please refer to FIGS. 1-6. FIGS. 1-6 are schematic drawings illustrating a manufacturing method of a semiconductor device according to a first embodiment of the present invention, wherein FIG. 1 is a top view diagram, and FIG. 2 may be regarded as a cross-sectional diagram taken along a line A-A' in FIG. 1. The manufacturing method of the semiconductor device in this embodiment may include the following steps. As shown in FIG. 1 and FIG. 2, a semiconductor substrate 10 is provided, and the semiconductor substrate 10 includes a first region R1 and a second region R2 defined thereon. A plurality of first gate structures GS1 is formed on the first region R1 of the semiconductor substrate 10. A plurality of second gate structures GS2 is formed on the second region R2 of the semiconductor substrate 10. In some embodiments, each of the first gate structures GS1 and each of the second gate structures GS2 may extend in a first direction D1 respectively, the first gate structures GS1 may be repeatedly disposed in a second direction D2 and have equal spacing distances (such as a first spacing distance S1 shown in FIG. 2), the second gate structures GS2 may be repeatedly disposed in the second direction D2 and have equal spacing distances (such as a second spacing distance S2 shown in FIG. 2), and the first direction D1 may be substantially orthogonal to the second direction D2, but not limited thereto. In some embodiments, the first gate structure GS1 and the second gate structure GS2 may also extend in different directions for other considerations. Additionally, the second spacing distance S2 between the second gate structures GS2 is larger than the first spacing distance S1 between the first gate structures GS1. There is not any second gate structure GS2 formed on the first region R1, and there is not any first gate structure GS1 formed on the second region R2. In other words, gate structures on the first region R1 have a relatively smaller spacing distance, and gate structures on the second region R2 have a relatively larger spacing distance.

In some embodiments, the first gate structures GS1 and the second gate structures GS2 may be formed together by the same process and have similar compositions, but not limited thereto. For example, in some embodiments, each of the first gate structures GS1 may include a first dielectric layer 21A, a first gate material layer 22A, and a first cap layer 23A disposed and stacked in a thickness direction D3 of the semiconductor substrate 10, and each of the second gate structures GS2 may include a second dielectric layer 21B, a second gate material layer 22B, and a second cap layer 23B disposed and stacked in the thickness direction D3 of the semiconductor substrate 10. The first dielectric layer 21A and the second dielectric layer 21B may include the same material, such as silicon oxide, silicon oxynitride, a high dielectric constant (high-k) material, or other suitable dielectric materials. The high-k material mentioned above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other appropriate high-k materials. The first gate material layer 22A and the second gate material layer 22B may include the same material, such as polysilicon, amorphous silicon, or conductive metal materials. The first cap layer 23A and the second cap layer 23B may include the same material, such as silicon nitride, silicon oxynitride, silicon carbon nitride (SiCN), or other suitable insulation materials. In some embodiments, the first gate material layer 22A in the first gate structure GS1 and the second gate material layer 22B in the second gate structure GS2 may be used as dummy gates in a replacement metal gate (RMG) process, but not limited thereto. Additionally, in some embodiments, a height of each of the first gate structures GS1 (such as a first height H1 shown in FIG. 2) maybe substantially equal to a height of each of the second gate structures GS2 (such as a second height H2 shown in FIG. 2), and a width of each of the first gate structures GS1 (such as a first width W1 shown in FIG. 2) may be smaller than a width of each of the second gate structures GS2 (such as a second width W2 shown in FIG. 2), but not limited thereto. In some embodiments, the first width W1 of each of the first gate structures GS1 may also be substantially equal to the second width W2 of each of the second gate structures GS2 according to other considerations.

In some embodiments, the semiconductor substrate 10 may include silicon substrate, epitaxial substrate, silicon-on-insulator (SOI) substrate, or a semiconductor substrate made of other appropriate materials. As shown in FIG. 1 and FIG. 2, a shallow trench isolation 11 may be formed in the semiconductor substrate 10 for defining a plurality of active areas 10A in the semiconductor substrate 10, and each of the first gate structures GS1 and each of the second gate structures GS2 may be partially disposed on corresponding active areas respectively, but not limited thereto. In some embodiments, the semiconductor substrate 10 may include a plurality of fin structures (not shown), and the shallow trench isolation 11 may be located between the fin structures. Each of the first gate structures GS1 and each of the second gate structures GS2 may be disposed straddling corresponding fin structures respectively.

Figure 3:
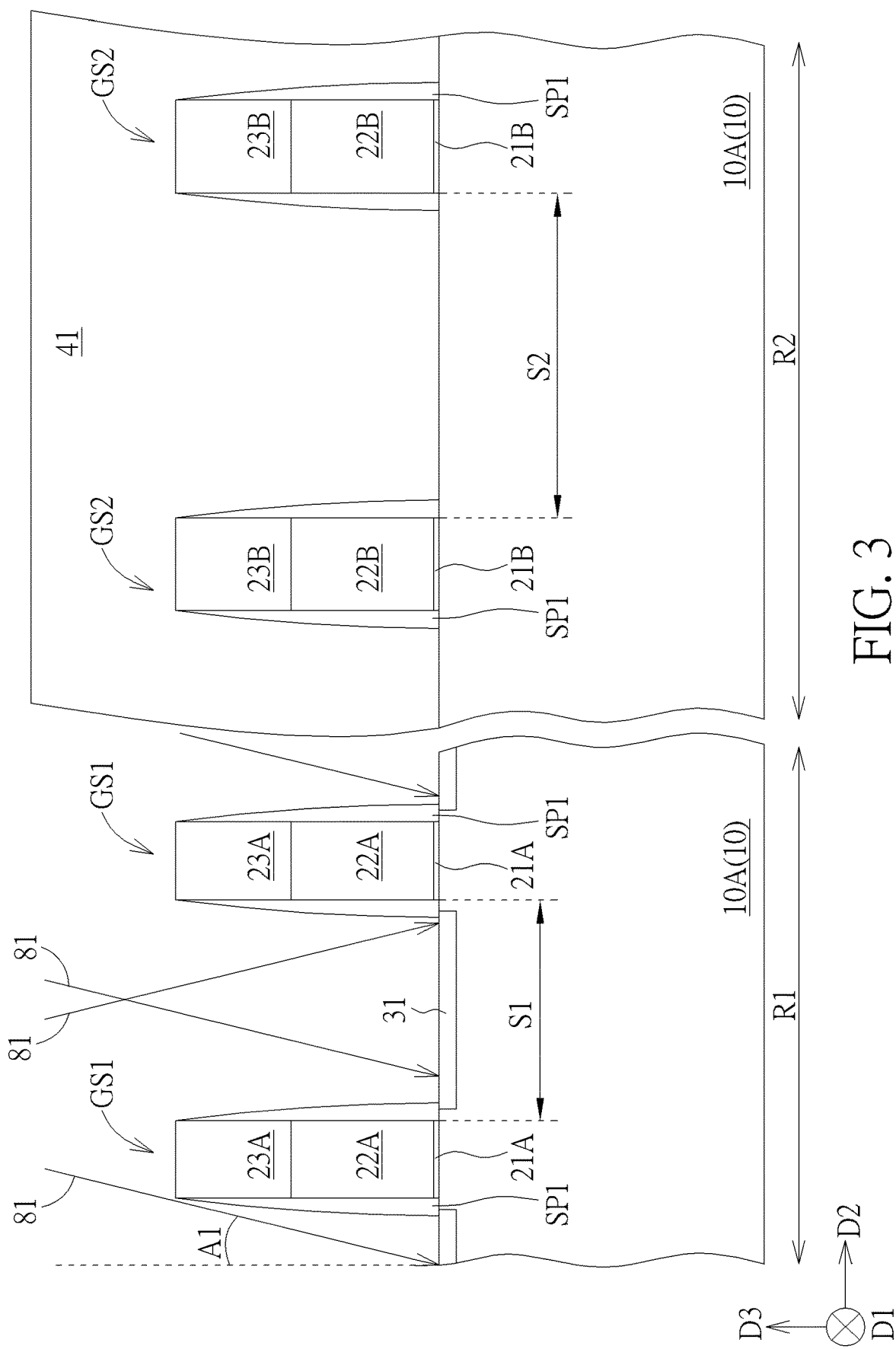

As shown in FIG. 3, a first ion implantation 81 is performed to form a first doped region 31 in the semiconductor substrate 10 between the first gate structures GS1. In some embodiments, before the first ion implantation 81, a first spacer SP1 may be formed on sidewalls of each of the first gate structures GS1 and sidewalls of each of the second gate structures GS2, and a first mask layer 41 may be formed covering the second region R2 and the second gate structures GS2 on the second region R2. In other words, the second region R2 of the semiconductor substrate 10 may be covered by the first mask layer 41 during the first ion implantation 81, and dopants of the first ion implantation 81 cannot be implanted into the semiconductor substrate 10 between the second gate structures GS2 because of the blocking effect generated by the first mask layer 41. In some embodiments, the first spacer SP1 may include a single layer structure or a multiple layer structure formed by insulation materials such as silicon oxide, silicon nitride, silicon oxynitride, or other suitable insulation materials, and the first mask layer 41 may include a photoresist material or other suitable mask materials.

Figure 4:
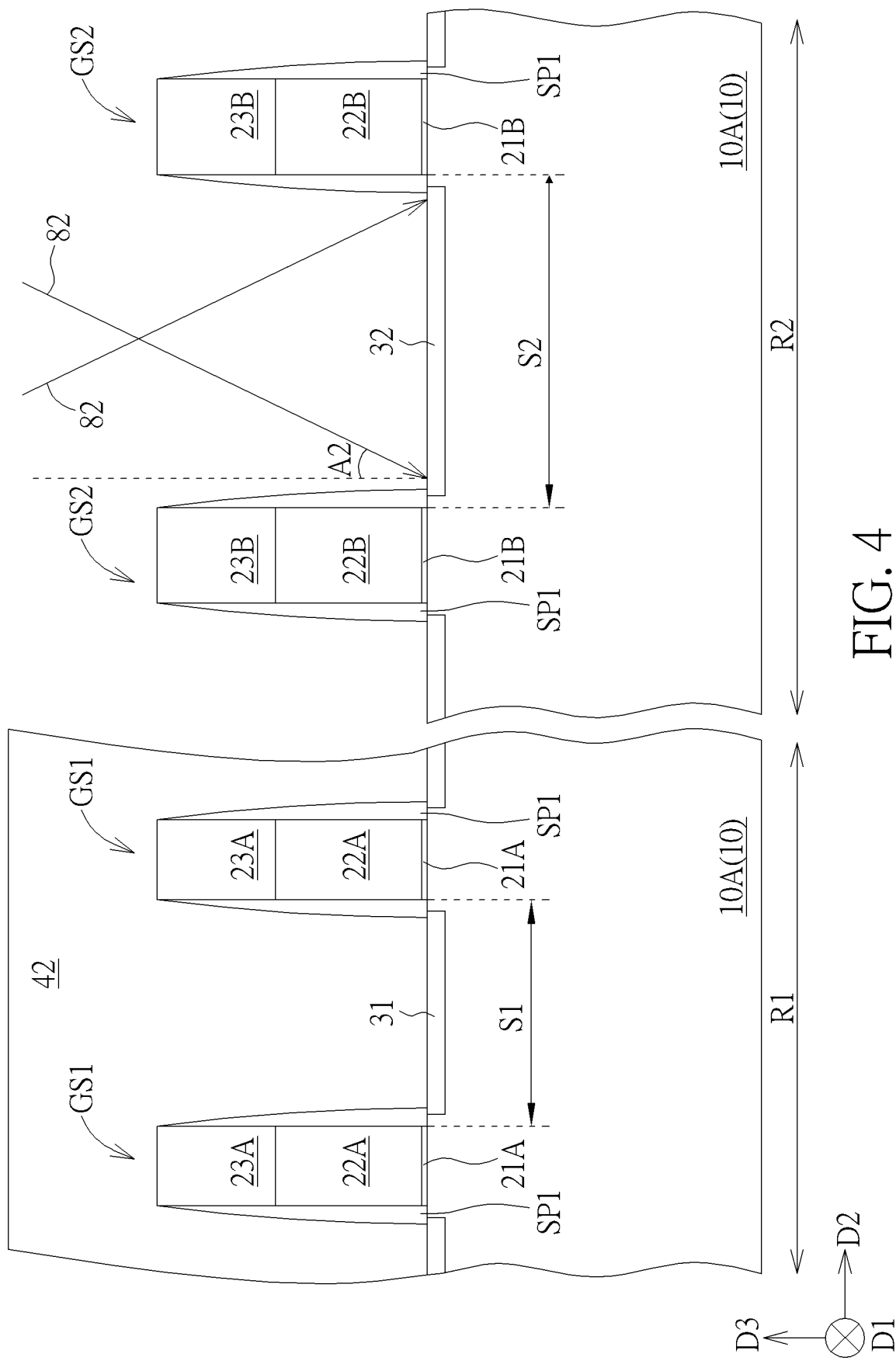

As shown in FIG. 4, a second ion implantation 82 is performed subsequently to form a second doped region 32 in the semiconductor substrate 10 between the second gate structures GS2. In some embodiments, a second mask layer 42 may be formed covering the first region R1 and the first gate structures GS1 on the first region R1 before the second ion implantation 82. In other words, the first region R1 of the semiconductor substrate 10 may be covered by the second mask layer 42 during the second ion implantation 82, and dopants of the second ion implantation 82 cannot be implanted into the semiconductor substrate 10 between the first gate structures GS2 because of the blocking effect generated by the second mask layer 42. The second mask layer 41 may include a photoresist material or other suitable mask materials.

As shown in FIG. 3 and FIG. 4, in some embodiments, the first ion implantation 81 and the second ion implantation 82 may be the same type of ion implantation, such as anion implantation for forming a lightly doped region and/or forming a pocket implantation effect, but not limited thereto. Therefore, in some embodiments, a dopant used in the first ion implantation 81 may be identical to a dopant used in the second ion implantation 82. For example, the dopant used in the first ion implantation 81 and the dopant used in the second ion implantation 82 may include arsenic (As), carbon (C), or other suitable materials.

Generally, problems such as structural damage and lattice disturbance may be generated when the dopant is implanted into the semiconductor substrate 10 by the ion implantation, the epitaxial quality of the epitaxial growth process performed subsequently may be influenced, and the dopant in the doped region may also influence etching performance of the etching process subsequently performed. Accordingly, for avoiding excessive variations of the ion implantation performance and the influence of the ion implantation mentioned above when spacing distances between gate structures are different and for avoiding excessive variations of the electrical performance of semiconductor devices formed in regions with different spacing distances between gate structures and reducing the influence on the manufacturing yield and circuit design, the ion implantations of the same type but with different process conditions are performed to the regions with different spacing distances between gate structures respectively in the present invention. The difference of the electrical properties between the regions with different spacing distances between gate structures may be reduced, and that will benefit the manufacturing yield and the design of the integrated circuits.

In other words, the first ion implantation 81 and the second ion implantation 82 may be the same type of ion implantation, but a part of the process conditions of the second ion implantation 82 may be different from those of the first ion implantation 81 for compensating the variation of the ion implantation effects and other influences caused by the different spacing distances between the gate structures. In some embodiments, a tilt angle of the second ion implantation 82 (such as a second tilt angle A2 shown in FIG. 4) may be larger than a tilt angle of the first ion implantation 81 (such as a first tilt angle A1 shown in FIG. 3), and an implantation dose of the second ion implantation 82 may be lower than an implantation dose of the first ion implantation 81 for improving the problems such as structural damage and lattice disturbance generated by the ion implantation when the spacing distance between the gate structures is relatively larger. In some embodiments, the tilt angle of the second ion implantation 82 may range from 20° to 30°, and the implantation dose of the second ion implantation 82 may range from 120E13 ions/cm$^2$ to 180E13 ions/cm$^2$, but not limited thereto. In some embodiments, the implantation dose of the second ion implantation 82 may range from 135E13 ions/cm$^2$ to 165E13 ions/cm$^2$.

Figure 5:
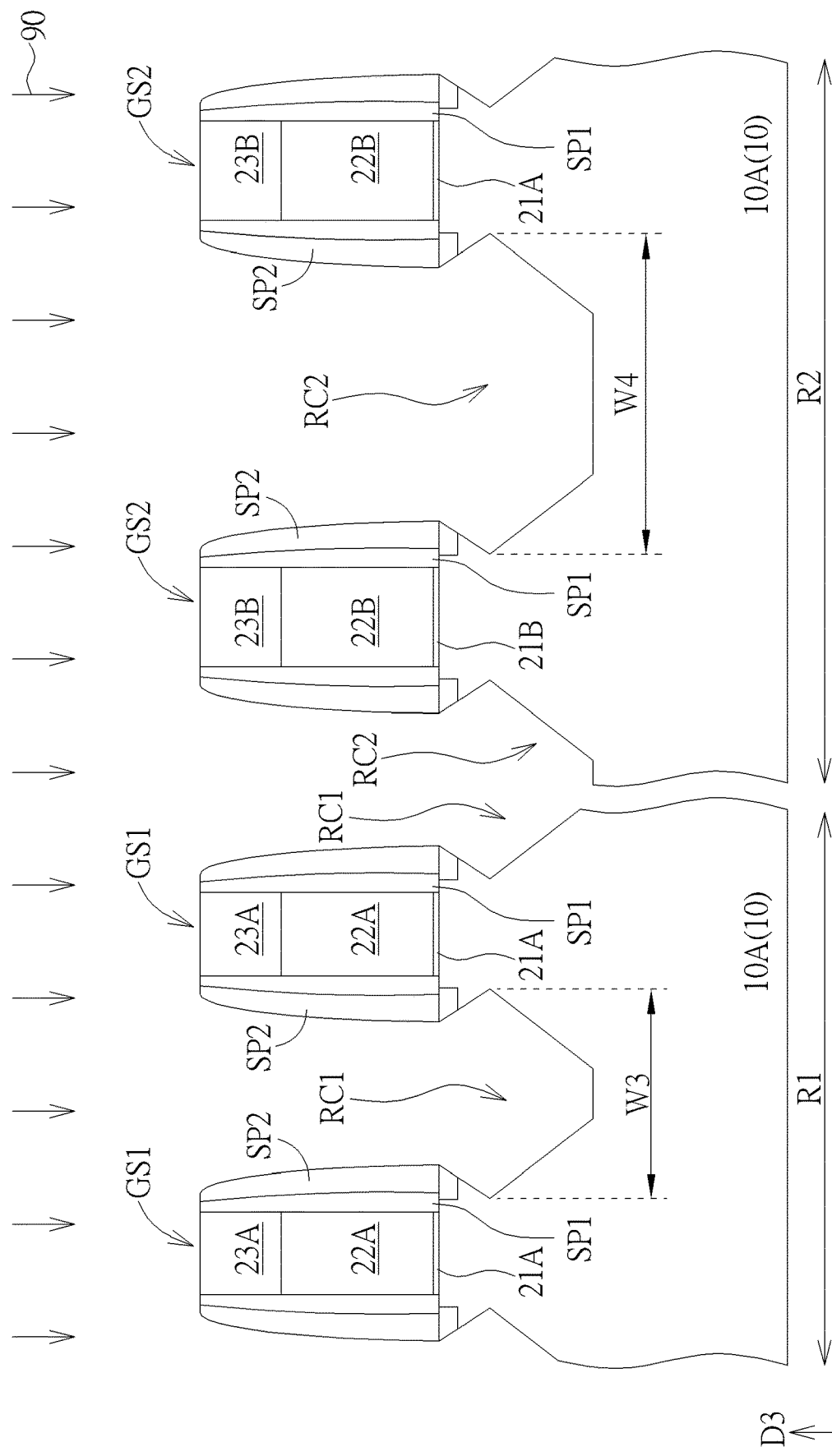

As shown in FIGS. 3-5, after the first ion implantation 81 and the second ion implantation 82, an etching process 90 is performed to remove at least a part of the first doped region 31 to form a first recess RC1 in the semiconductor substrate 10 and remove at least a part of the second doped region 32 to form a second recess RC2 in the semiconductor substrate 10. In some embodiments, the first mask layer 41 and the second mask layer 42 maybe removed before the etching process 90, and a second spacer SP2 may be formed on the first spacer SP1 before the etching process 90. The first cap layer 23A, the second cap layer 23B, the first spacer SP1, and the second spacer SP2 may be used as a mask in the etching process 90, but not limited thereto. Specifically, in some embodiments, the first ion implantation 81 may be performed before the second ion implantation 82, the first mask layer 41 may be removed before the second ion implantation 82, and the second mask layer 42 may be formed after the step of removing the first mask layer 41, but the present invention is not limited to this. In some embodiments, the first ion implantation 81 may be performed after the second ion implantation 82 according to other considerations, and the forming steps and the removing steps of the first mask layer 41 and the second mask layer may be modified accordingly.

Additionally, in some embodiments, the etching process 90 may include an anisotropic etching process such as a dry etching process for forming a perpendicular etching effect, and an isotropic etching process such as a wet etching process maybe used to provide a lateral etching effect and form the required recess condition. As shown in FIG. 5, in some embodiments, the etching process 90 may etch the semiconductor substrate 10 along a specific profile and remove apart of the first doped region 31 and a part of the second doped region 32, and the first recess RC1 and the second recess RC2 formed by the etching process 90 may have a diamond shaped polygon in the cross-section view, but not limited thereto. A width of the first recess RC1 (such as a third width W3 shown in FIG. 5) may be smaller than a width of the second recess RC2 (such as a fourth width W4 shown in FIG. 5) because the spacing distance between the first gate structures GS1 is smaller than the spacing distance between the second gate structures GS2.

Figure 6:
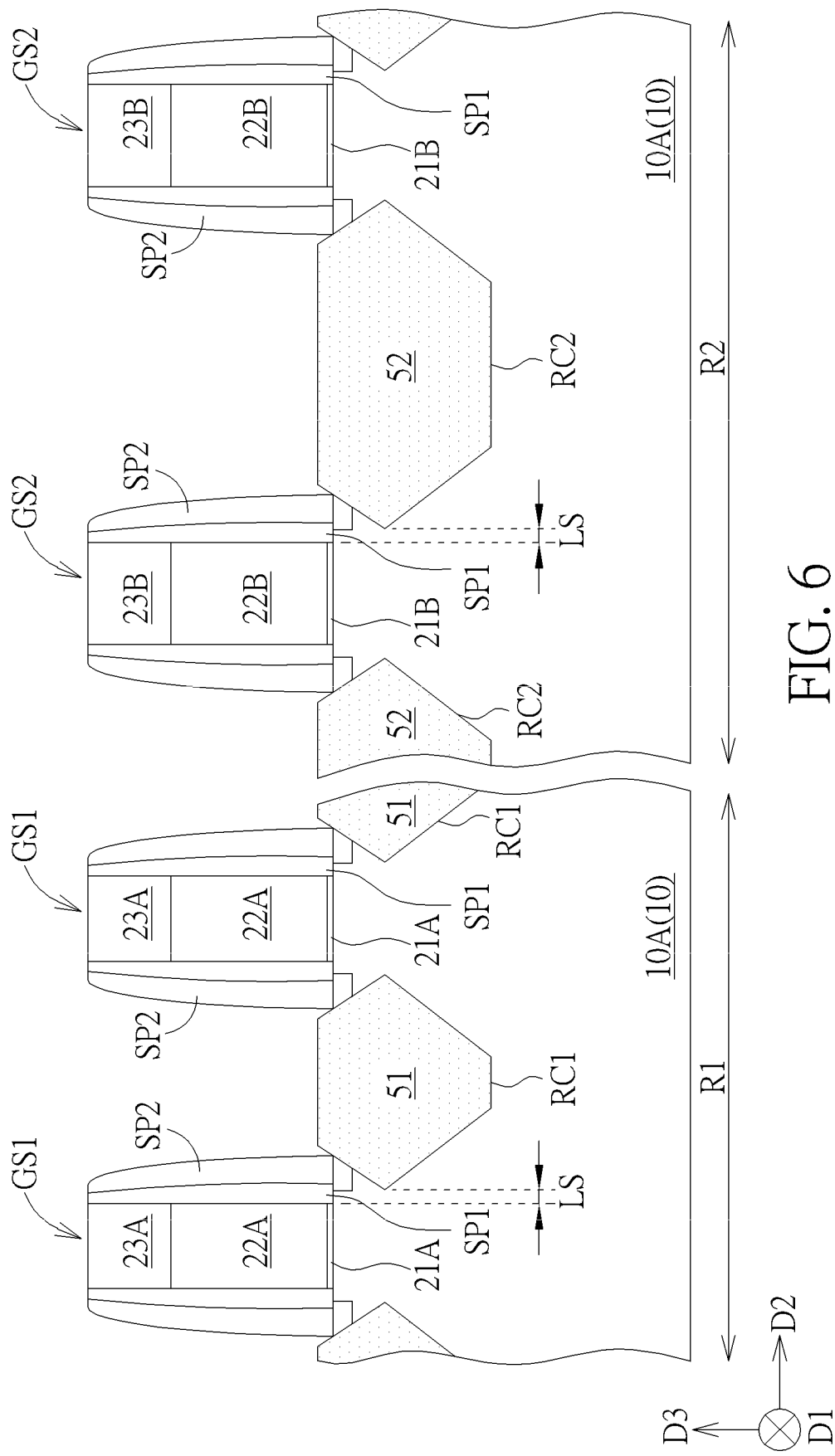

As shown in FIG. 6, a selective epitaxial growth (SEG) process may be performed to form a first epitaxial structure 51 in the first recess RC1 and a second epitaxial structure 52 in the second recess RC2, and a composition of the first epitaxial structure 51 may be identical to a composition of the second epitaxial structure 52. In some embodiments, the first epitaxial structure 51 and the second epitaxial structure 52 may include a silicon germanium (SiGe) epitaxial structure or a silicon carbide (SiC) epitaxial structure respectively. In addition, another ion implantation can be performed before or after the SEG process, or a co-implant can be performed during the SEG process for implanting the required dopant into the first epitaxial structure 51 and the second epitaxial structure 52, and thus the first epitaxial structure 51 and the second epitaxial structure 52 may serve as a source/drain of a transistor device respectively. The first epitaxial structure 51 and the second epitaxial structure 52 may be formed along the bottom surfaces and the lateral surfaces of the first recess RC1 and the second recess RC2 respectively and obtain the profile of the first recess RC1 and the profile of the second recess RC2 respectively. Therefore, the first epitaxial structure 51 and the second epitaxial structure 52 may have a pointed end toward the corresponding channel region respectively, and the pointed ends may be used to provide stress to the channel region more effectively, and the carrier mobility of the channel region in the transistor device may be increased accordingly. A lateral space LS between the first epitaxial structure 51 and one of the first gate structures GS1 is equal to the lateral space LS between the second epitaxial structure 52 and one of the second gate structures GS2. The lateral space LS is defined to be a horizontal distance between an edge of the first dielectric layer 21A of one of the first gate structures GS1 and the pointed end of the first epitaxial structure 51, and also the horizontal distance between an edge of the second dielectric layer 21B of one of the second gate structures GS2 and the pointed end of the second epitaxial structure 52, respectively.

Figure 7:
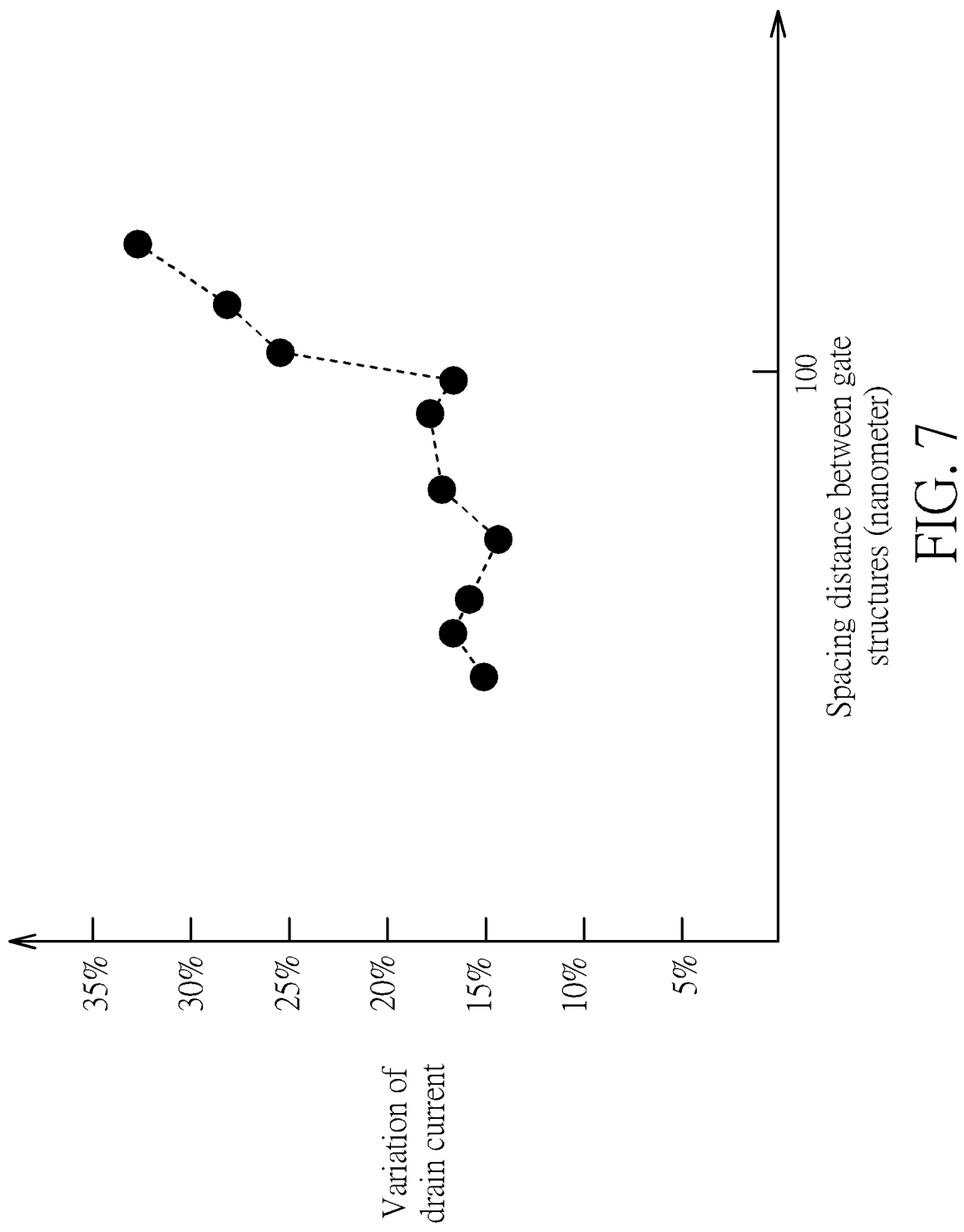
FIG. 7 is a schematic diagram illustrating a relation between drain current variations and spacing distances between gate structures.

Please refer to FIG. 6 and FIG. 7. FIG. 7 is a schematic diagram illustrating a relation between the spacing distances between the gate structures and the drain current variations of transistors having different spacing distances between gate structures when the ion implantations with the same process conditions are performed to regions having different spacing distances between the gate structures. As shown in FIG. 7, when the ion implantations with the same process conditions are applied and the spacing distance between the gate structures is larger than 100 nanometers, the variation of the drain current is obviously increased to about 25%~30% while the variation is about 15% for the spacing distance smaller than 100 nanometers. Accordingly, an ion implantation with different process conditions has to be performed to the region with larger spacing distance between the gate structures for reducing the variation of the electrical properties between the regions with different spacing distances between gate structures, and the purposes of enhancing the manufacturing yield and improving the uniformity of the electrical properties may be achieved accordingly. Therefore, as shown in FIG. 2, the second spacing distance S2 between the second gate structures GS2 may be larger than 100 nanometers, or the second spacing distance S2 between the second gate structures GS2 may be larger than 120 nanometers in some embodiments, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
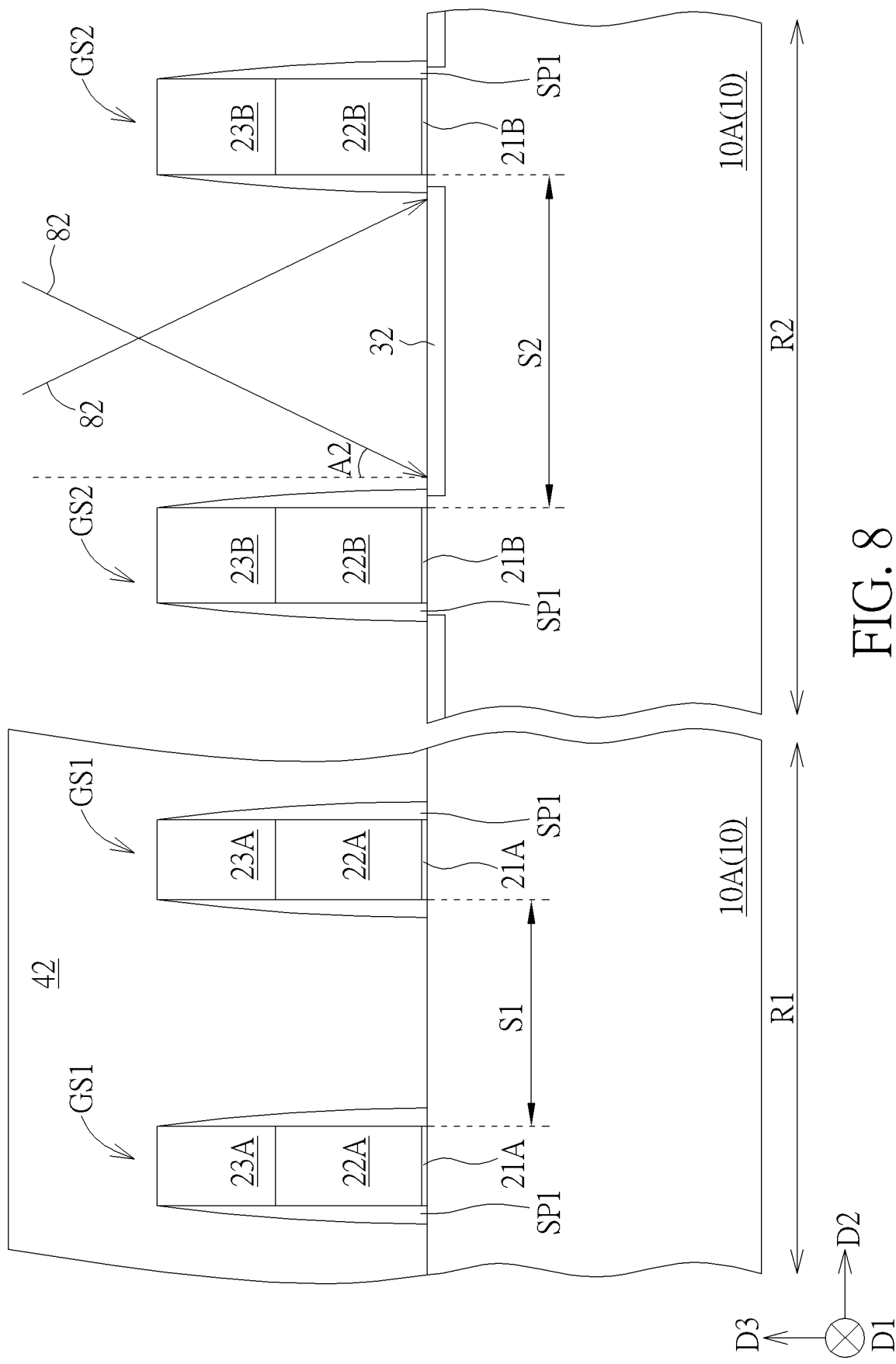
Figure 9:
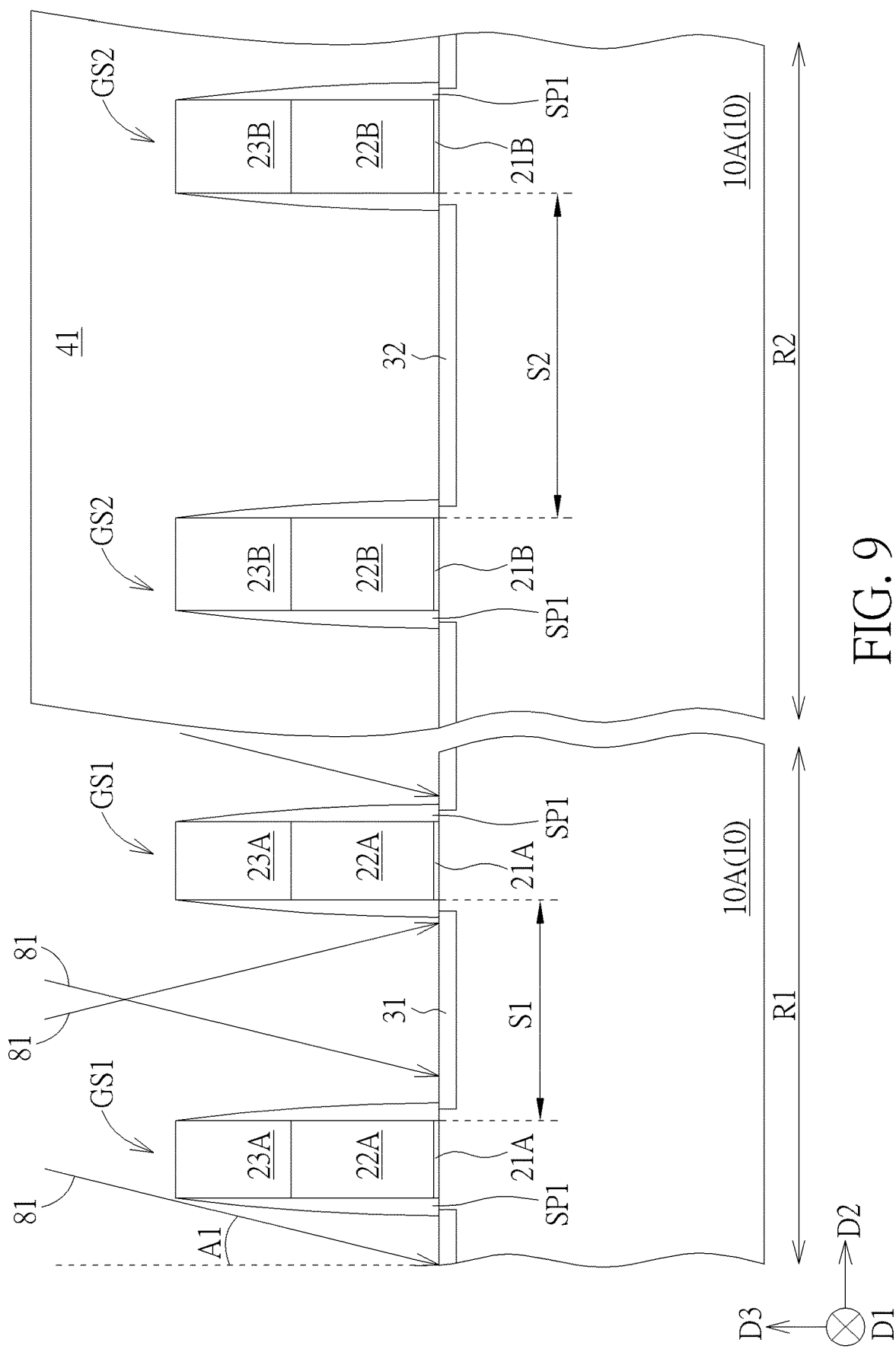

Please refer to FIG. 8 and FIG. 9. FIG. 8 and FIG. 9 are schematic drawings illustrating a manufacturing method of a semiconductor device according to a second embodiment of the present invention. As shown in FIG. 8 and FIG. 9, the difference between this embodiment and the first embodiment mentioned above is that, in the manufacturing method of this embodiment, the first ion implantation 81 may be performed after the second ion implantation 82. Therefore, in some embodiments, the second mask layer 42 may be removed before the first ion implantation 81, and the first mask layer 41 may be formed after the step of removing the second mask layer 41, but not limited thereto.

To summarize the above descriptions, in the manufacturing method of the semiconductor device of the present invention, the ion implantations of the same type but with different process conditions may be performed to the regions with different spacing distances between the gate structures respectively. The variation of the electrical properties of semiconductor devices subsequently formed in the regions with different spacing distances between the gate structures may be reduced. The uniformity of the electrical properties of the semiconductor devices may be improved, and the related manufacturing yield may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device comprising:

providing a semiconductor substrate comprising a first region and a second region defined thereon;

forming a plurality of first gate structures on the first region of the semiconductor substrate, wherein each of the first gate structures comprises a first gate material layer and a first dielectric layer disposed between the first gate material layer and the semiconductor substrate;

forming a plurality of second gate structures on the second region of the semiconductor substrate, wherein each of the second gate structures comprises a second gate material layer and a second dielectric layer disposed between the second gate material layer and the semiconductor substrate, wherein a spacing distance between the second gate structures is larger than a spacing distance between the first gate structures, and a width of each of the first gate structures is smaller than a width of each of the second gate structures, wherein the spacing distance between the second gate structures is larger than 100 nanometers, and the spacing distance between the second gate structures is defined to be a distance between a left edge of the second dielectric layer of one of the second gate structures and a right edge of the second dielectric layer of an adjacent second gate structure;

performing a first ion implantation to form a first doped region in the semiconductor substrate between the first gate structures;

performing a second ion implantation to form a second doped region in the semiconductor substrate between the second gate structures, wherein a tilt angle of the second ion implantation is larger than a tilt angle of the first ion implantation, and an implantation dose of the second ion implantation is lower than an implantation dose of the first ion implantation;

performing an etching process to remove at least a part of the first doped region to form a first recess in the semiconductor substrate and remove at least a part of the second doped region to form a second recess in the semiconductor substrate;

forming a spacer on sidewalls of the first gate structures and sidewalls of the second gate structures after the first ion implantation and the second ion implantation, wherein the spacer remains on the first gate structures and the second gate structures during the etching process;

forming a first epitaxial structure in the first recess; and forming a second epitaxial structure in the second recess, wherein a composition of the first epitaxial structure is identical to a composition of the second epitaxial structure, and a lateral space between the first epitaxial structure and one of the first gate structures is equal to the lateral space between the second epitaxial structure and one of the second gate structures, wherein the lateral space is defined to be a horizontal distance between an edge of the first dielectric layer of one of the first gate structures and a pointed end of the first epitaxial structure, and also the horizontal distance between an edge of the second dielectric layer of one of the second gate structures and the pointed end of the second epitaxial structure, respectively.

2. The manufacturing method of the semiconductor device according to claim 1, wherein the spacing distance between the second gate structures is larger than 120 nanometers.

3. The manufacturing method of the semiconductor device according to claim 1, wherein the tilt angle of the second ion implantation ranges from 20° to 30°.

4. The manufacturing method of the semiconductor device according to claim 1, wherein the implantation dose of the second ion implantation ranges from 120E13 ions/cm$^2$ to 180E13 ions/cm$^2$.

5. The manufacturing method of the semiconductor device according to claim 4, wherein the implantation dose of the second ion implantation ranges from 135E13 ions/cm$^2$ to 165E13 ions/cm$^2$.

6. The manufacturing method of the semiconductor device according to claim 1, wherein a dopant used in the first ion implantation is identical to a dopant used in the second ion implantation.

7. The manufacturing method of the semiconductor device according to claim 6, wherein the dopant used in the first ion implantation and the dopant used in the second ion implantation comprise arsenic (As) or carbon (C).

8. The manufacturing method of the semiconductor device according to claim 1, wherein the first epitaxial structure and the second epitaxial structure comprise a silicon germanium (SiGe) epitaxial structure respectively.

9. The manufacturing method of the semiconductor device according to claim 1, further comprising:
    forming a first mask layer covering the second region of the semiconductor substrate, wherein the second region of the semiconductor substrate is covered by the first mask layer during the first ion implantation; and
    forming a second mask layer covering the first region of the semiconductor substrate, wherein the first region of the semiconductor substrate is covered by the second mask layer during the second ion implantation;
    removing the first mask layer before the etching process; and
    removing the second mask layer before the etching process.

10. The manufacturing method of the semiconductor device according to claim 9, wherein the first ion implantation is performed before the second ion implantation.

11. The manufacturing method of the semiconductor device according to claim 10, wherein the first mask layer is removed before the second ion implantation.

12. The manufacturing method of the semiconductor device according to claim 10, wherein the second mask layer is formed after the step of removing the first mask layer.

13. The manufacturing method of the semiconductor device according to claim 9, wherein the first ion implantation is performed after the second ion implantation.

14. The manufacturing method of the semiconductor device according to claim 13, wherein the second mask layer is removed before the first ion implantation.

15. The manufacturing method of the semiconductor device according to claim 13, wherein the first mask layer is formed after the step of removing the second mask layer.

16. The manufacturing method of the semiconductor device according to claim 1, wherein a height of each of the first gate structures is equal to a height of each of the second gate structures.

17. The manufacturing method of the semiconductor device according to claim 1, wherein a width of the first recess is smaller than a width the second recess.

* * * * *